United States Patent
Li et al.

(10) Patent No.: US 8,911,033 B2
(45) Date of Patent: Dec. 16, 2014

(54) PANEL FOR VENTILATION AND NOISE REDUCTION AND MANUFACTURING METHOD

(75) Inventors: Baosheng Li, Shenzhen (CN); Jun Zhao, Shenzhen (CN); Chengpeng Yang, Shenzhen (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 0 days.

(21) Appl. No.: 13/607,303

(22) Filed: Sep. 7, 2012

(65) Prior Publication Data

US 2013/0082584 A1 Apr. 4, 2013

Related U.S. Application Data

(63) Continuation of application No. PCT/CN2011/080419, filed on Sep. 30, 2011.

(51) Int. Cl.
*A47B 88/00* (2006.01)
*H05K 7/20* (2006.01)
*H05K 5/02* (2006.01)

(52) U.S. Cl.
CPC .......... *H05K 7/20736* (2013.01); *H05K 5/0213* (2013.01)
USPC ........................................ 312/223.2; 454/184

(58) Field of Classification Search
USPC ............ 312/223.2, 223.1; 361/724–727, 690; 454/184
See application file for complete search history.

(56) References Cited

U.S. PATENT DOCUMENTS

| | | | |
|---|---|---|---|
| 3,120,166 A * | 2/1964 | Lyman | 454/307 |
| 5,931,002 A | 8/1999 | Nagashima | |
| 6,494,779 B1 * | 12/2002 | Nicolai et al. | 454/184 |
| 7,226,352 B2 | 6/2007 | Oh | |
| 7,334,662 B1 | 2/2008 | Anderl | |
| 7,857,688 B1 * | 12/2010 | Cunningham et al. | 454/184 |
| 7,983,038 B2 * | 7/2011 | Levesque et al. | 361/692 |
| 2006/0148399 A1 * | 7/2006 | Su | 454/184 |
| 2007/0171613 A1 * | 7/2007 | McMahan et al. | 361/695 |

(Continued)

FOREIGN PATENT DOCUMENTS

| | | |
|---|---|---|
| CN | 101466251 A | 6/2009 |
| CN | 102110442 A | 6/2011 |

(Continued)

OTHER PUBLICATIONS

Search Report issued in corresponding PCT Application No. PCT/CN2011/080419; mailed Jun. 21, 2012.

*Primary Examiner* — Daniel Rohrhoff
(74) *Attorney, Agent, or Firm* — Huawei Technologies Co., Ltd

(57) ABSTRACT

A panel for ventilation and noise reduction and its manufacturing method are disclosed A left side and a right side of the panel each include one or a plurality of ventilation holes, and a sound insulation board for sound insulation is set near each ventilation hole along an inner side of the panel, so that at least certain sound from the inner of the electronic device needs to bypass the board to pass through the ventilation holes; and the ventilation hole on the left side and the right side of the panel are opened in a staggered position, so that when the panel is placed side by side with another panel, air exhausted from a ventilation hole at an adjacent side of the panel does not form strong face-to-face blowing interference with air exhausted from a ventilation hole at an adjacent side of another panel.

18 Claims, 14 Drawing Sheets

(56) References Cited

U.S. PATENT DOCUMENTS

| | | | |
|---|---|---|---|
| 2007/0218826 A1* | 9/2007 | Walsh et al. | 454/184 |
| 2007/0230124 A1* | 10/2007 | Bartell et al. | 361/695 |
| 2010/0122792 A1* | 5/2010 | Shabbir et al. | 165/47 |
| 2011/0175499 A1* | 7/2011 | Zhao et al. | 312/198 |

FOREIGN PATENT DOCUMENTS

| | | |
|---|---|---|
| JP | 63-87892 | 6/1988 |
| JP | 2565163 | 12/1997 |
| JP | 10227551 | 8/1998 |

\* cited by examiner

The sound is transferred externally directly through ventilation holes when no soundproofing panel exists (a)

Certain sound cannot be transferred externally directly through a ventilation hole when a soundproofing panel exists (b)

The arrow indicates the air direction

The arrow indicates the air direction

PANEL FOR VENTILATION AND NOISE REDUCTION AND MANUFACTURING METHOD

CROSS-REFERENCE TO RELATED APPLICATIONS

This application is a continuation of International Application No. PCT/CN2011/080419, filed on Sep. 30, 2011, which is hereby incorporated by reference in its entirety.

FIELD OF THE DISCLOSURE

The present disclosure relates to the field of communications technologies, and in particular to a panel for ventilation and noise reduction and its manufacturing method.

BACKGROUND

Electronic components in electronic devices generate heat when they are working, which increases the temperature around the electronic components, thereby affecting normal working of the electronic components. To ensure normal working of devices, certain methods must be applied for heat dissipation of the devices. At present, the most common heat dissipation method is to use a fan, that is, to rotate the fan to form a ventilation channel (convection channel) between the inner and outer surfaces of a device. In this way, external cool air is brought in and internal heat is exhausted, so that the internal temperature of the device is controlled.

Fan rotation produces noise. The produced noise increases with the number of fans, rotation speed, and volume of air. Especially in some large-scale electronic device cabinets and data centers, the noise (especially mid- and high-frequency noise) generated by a large number of fans will impose an adverse impact on the physical and psychological health of surrounding people.

In the prior art, to reduce the noise, sound insulation boards are generally installed on devices. The sound insulation boards here refer to panels that produce sound insulation effects. Cabinet walls and cabinet doors can also be viewed as sound insulation boards. To yield the optimal sound insulation effect, the ideal scheme is to isolate the sound source from the external space by using sound insulation boards, so that the sound cannot directly penetrate the panels, thereby reducing the noise. For example, for a large-scale data center, an enclosed door can be designed to isolate the sound source from the external space. However, a fully enclosed sound insulation board will block air convection, which affects heat dissipation capability. In this case, some air ventilation holes need to be opened on the sound insulation board to increase air convection. These holes, however, allow sound to penetrate through the panel to pass through the device, thereby increasing the noise. As such, how to achieve the balance between ventilation and noise reduction to yield considerable comprehensive benefits has become an urgent problem in the industry.

SUMMARY

Embodiments of the present invention provide a panel for ventilation and noise reduction, a cabinet, an electronic device system, a method for manufacturing the panel, and a method for ventilation and noise reduction for an electronic device to solve the problem in the prior art regarding how to achieve the balance between ventilation and noise reduction to yield considerable comprehensive benefits.

The panel for ventilation and noise reduction provided in an embodiment of the present invention is installed on a ventilation port of an apparatus that accommodates an electronic device, where the panel protrudes externally relative to the electronic device.

A left side and a right side of the panel each comprise one or a plurality of ventilation holes, and a sound insulation board for sound insulation is set near each ventilation hole along an inner side of the panel, so that at least certain sound from the inner of the electronic device needs to bypass the sound insulation board to pass through the ventilation holes.

The ventilation hole(s) on the left side of the panel and the ventilation hole(s) on the right side of the panel are opened in staggered position, so that when the panel is placed side by side with another panel that is the same as the panel, air exhausted from the panel's ventilation hole(s) close to an adjacent side does not form strong face-to-face blowing interference with air exhausted from the another panel's ventilation hole(s) close to the adjacent side.

The cabinet provided in an embodiment of the present invention includes:

a cabinet body, for example, the panel for ventilation and noise reduction;

where an electronic device is placed in the cabinet body, one or a plurality of cabinet doors are formed at openings of the cabinet body, and the panel is set on the one or the plurality of cabinet doors.

The method for manufacturing the panel for ventilation and noise reduction provided in an embodiment of the present invention includes:

punching or cutting certain edges of a ventilation hole shape on each of a left side and a right side of the panel according to a preset ventilation hole shape to form a bendable part;

bending the formed bendable part along an uncut edge of the preset ventilation hole shape, to form a ventilation hole and a sound insulation board; where with the sound insulation board, at least certain sound from the inner of an electronic device needs to bypass the sound insulation board to pass through ventilation hole; a ventilation hole on the left side of the panel and a ventilation hole on the right side of the panel are opened in staggered position in the vertical direction relative to a horizontal plane, so that when the panel is placed side by side with another panel that is the same as the panel, air exhausted from a ventilation hole at an adjacent side of the panel does not form strong face-to-face blowing interference with air exhausted from a ventilation hole at an adjacent side of the other panel; and bending the panel according to a preset shape, so that the panel protrudes externally relative to the electronic device after the panel is installed on the ventilation port of the electronic device.

The method for ventilation and noise reduction for an electronic device provided in an embodiment of the present invention includes:

installing the electronic device through an opening on one side or a plurality of sides of a cabinet body to the inner of the cabinet body; and installing the aforementioned panel at the opening on the one side or the plurality of sides of the cabinet body, so that when a fan of the electronic device rotates, the panel can reduce noise produced by the fan, so as to ensure air ventilation and convection.

An electronic device system provided in an embodiment of the present invention includes:

an electronic device, which includes a fan and the fan is configured to perform heat dissipation for the electronic device; where the cabinet is configured to accommodate the electronic device, and reduce noise produced by the fan, so as to ensure air ventilation and convection.

In the preceding technical scheme, the sound insulation board can prevent the sound from directly spreading externally, thereby achieving the sound insulation effect; in addition, the installation of the ventilation port meets requirements for ventilation; besides, the staggered position of ventilation holes can avoid strong face-to-face blowing interference, so as to ensure heat dissipation efficiency.

BRIEF DESCRIPTION OF THE DRAWINGS

To clearly illustrate technical solutions in the embodiments of the present invention, the drawings used for describing the embodiments of the present invention or the prior art are described briefly in the following. Apparently, the drawings to be described in the following are only about some embodiments of the present invention. Those skilled in the art can obtain other drawings based on these drawings without innovative work.

DETAILED DESCRIPTION OF THE EMBODIMENTS

To make the purposes, technical solutions, and advantages of the present invention clearer, the following further describes the present invention in detail through relevant drawings and exemplary embodiments.

Embodiment 1

Figure 1:
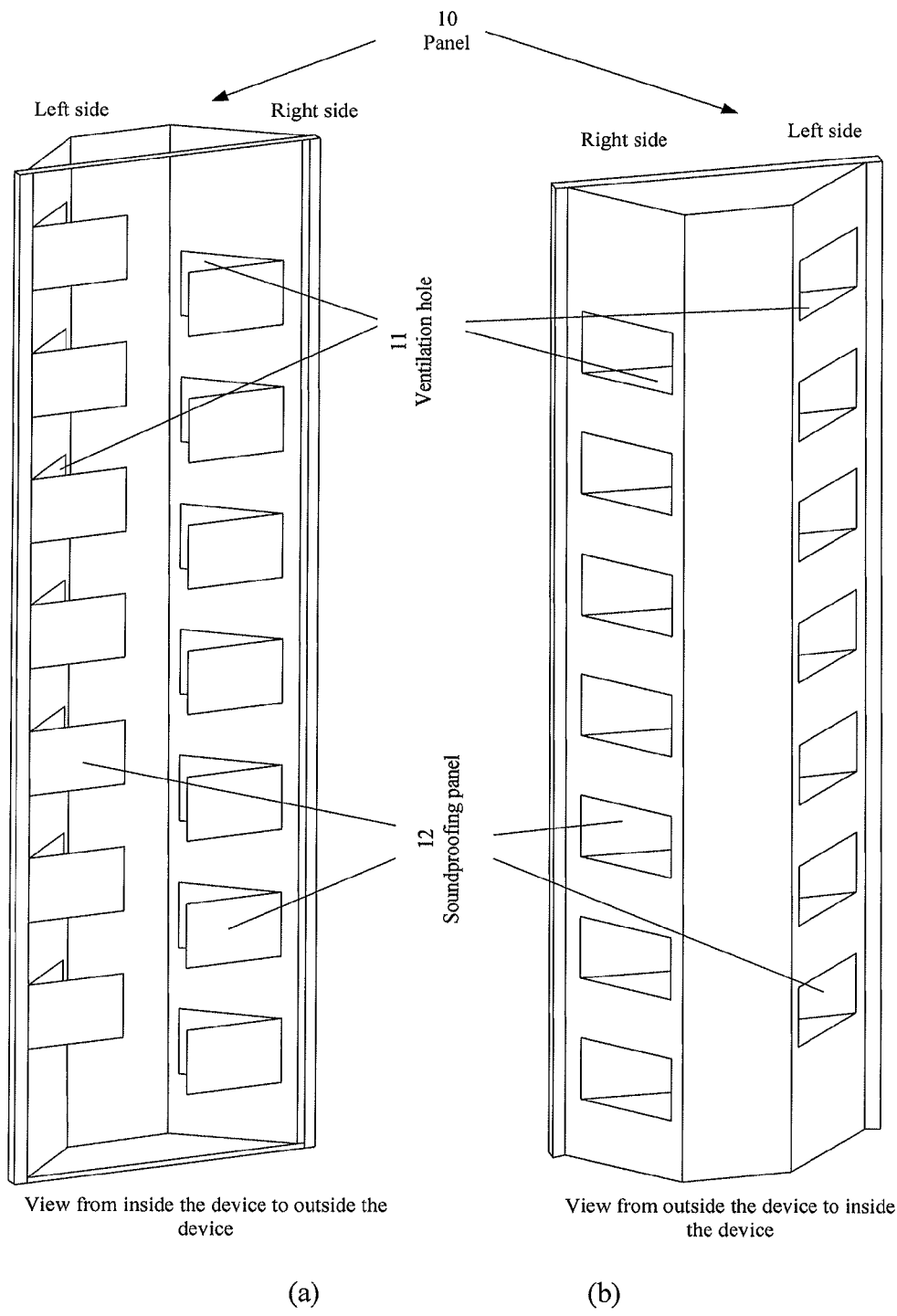
FIG. 1 is a structural schematic diagram of a panel for ventilation and noise reduction provided in a first embodiment of the present invention.

As shown in FIG. 1, an embodiment of the present invention includes a panel for ventilation and noise reduction, and the panel is installed on a ventilation port of an apparatus that accommodates an electronic device, where the panel protrudes externally relative to the electronic device.

The electronic device here generally refers to a device (for example, some large-scale server device) that has a fan and may produce large noise. However, this embodiment does not exclude another electronic device that does not have a fan (in this case, a fan set externally may be required for heat dissipation). The apparatus that accommodates the electronic device generally refers to an enclosure, such as a cabinet and a chassis of a personal computer. For the ease of description, the "apparatus that accommodates the electronic device" in this embodiment can be viewed as a cabinet or chassis without a panel. In another description manner, the "apparatus" may also refer to a cabinet or chassis with a panel. Both have no essential difference. Those skilled in the art can implement this solution according to the preceding description.

A left side and a right side of the panel each include one or a plurality of ventilation holes 11, and a sound insulation board 12 for sound insulation is set near each ventilation hole 11 along an inner side (the side facing the electronic device inside the apparatus) of the panel, so that at least certain sound from the inner of the electronic device needs to bypass the sound insulation board 12 to pass through the ventilation hole 11;

A ventilation hole 11 on the left side of the panel and a ventilation hole 11 on the right side of the panel are opened on the panel in staggered position, so that when the panel is placed side by side with another panel that is the same as the panel, air exhausted from the panel's ventilation hole(s) 11 close to an adjacent side does not form strong face-to-face blowing interference with air exhausted from the another panel's ventilation hole(s) 11 close to the adjacent side.

The "left side" and "right side" in this embodiment can be defined as the "left side" and "right side" in the view from inside of the device to outside of the device [as shown in FIG. 1(a)], that is, the "left side" and "right side" on a paper plane. Naturally, in the view from outside of the device to inside of the device [as shown in FIG. 1(b)], the "left side" on the paper plane is the "right side" of the panel, and the "right side" on the paper plane is the "left side" of the panel in the preceding definition. Definitely, the "left side" and "right side" can be defined from another view, and details are not described herein.

It can be understood that as a ventilation hole is used for ventilation, certain ventilation space needs to be reserved, and the sound insulation board should not affect ventilation of the ventilation hole. Those skilled in the art can set the size of the ventilation space for the ventilation hole according to a specific ventilation requirement, and details will not provided here.

Further, in this embodiment of the present invention, a ventilation hole and a sound insulation board are obtained through a unibody design processing method. Certain edges of a ventilation hole shape are punched or cut to form a bendable part, and the formed bendable part is bent along an edge of the ventilation hole shape, where the edge of the ventilation hole shape is not cut, so as to form the ventilation hole and the sound insulation board at the same time. The processing method, such as cutting and bending, is a mechanical processing method that is easily implemented. Therefore, compared with the method of additionally processing the sound insulation board and connecting the sound insulation board to parts around the ventilation hole through soldering, pasting, fixing, or other means, the processing method is greatly simplified.

In addition to that the ventilation hole and sound insulation board can also be obtained through the unibody design processing method, the shape of the panel is also obtained through unibody design, that is, a plate (such as a metal plate) is bent according to a preset shape of the panel to form a panel of a specific shape.

In addition, in another embodiment, a panel, a ventilation hole, and a sound insulation board may be obtained through another method rather than the unibody design method. For example, the panel of a specific shape can be obtained by combining several sections, or the sound insulation board is fixed on the edge of the ventilation hole in a manner, such as soldering, clamping. It should be noted that the sound insulation board being on the edge of the ventilation hole is not confined to a case where the sound insulation board is completely aligned to the edge of the ventilation hole. A certain distance from the edge (for example, the sound insulation board is set several centimeters away from the edge) is allowed. Whether a distance or no distance is selected, and how long is a distance to be selected, can be determined according to an actual application scenario. These techniques pertain to the common knowledge to those skilled in the art and details are not described here.

As a ventilation hole is set in this embodiment of the present invention, ventilation of the device can be guaranteed. In addition, a sound insulation board is set around the ventilation hole, so that sound can be prevented from directly getting out of the ventilation hole, thereby reducing noise. Through the embodiment of the present invention, a ventilation requirement is met and the noise is also reduced, and favorable comprehensive benefits can be yielded.

In addition, in this embodiment of the present invention, an application scenario where multiple electronic devices are placed side by side is considered. For this scenario, in this embodiment of the present invention, ventilation holes are set in staggered position in the vertical direction relative to a horizontal plane on two sides, so that the air exhausted from the ventilation holes on the adjacent sides of two devices does not form strong face-to-face blowing interference, thereby avoiding a problem that heat dissipation performance is lowered due to a case where the heated air of one device enters another device or affects the air convection of another device. The "strong face-to-face blowing interference" here is relative to the face-to-face blowing interference formed when no staggered position is used. According to different application scenarios, the specific definition of "strong face-to-face blowing interference" varies. Those skilled in the art can define the "strong face-to-face blowing interference" according to specific engineering application scenarios. For example, in some application scenarios, a small amount of face-to-face blowing interference can be deemed as "strong face-to-face blowing interference", whereas in another application scenario, only a larger amount of face-to-face blowing interference can be deemed as "strong face-to-face blowing interference". In addition, those skilled in the art can obviously observe that, when the stagger distance between ventilation holes on both sides increases, the face-to-face blowing interference decreases; when the stagger distance decreases, or certain ventilation holes on both sides overlap, the interference increases. Therefore, the stagger distance can be adjusted to ensure that the air exhausted from the ventilation holes on both sides does not form "strong face-to-face blowing interference".

In this embodiment, the staggered position can be in the vertical direction relative to the horizontal plane, or the staggered position is left-right staggered position on a folded plane, or a combination of both.

Finally, this embodiment of the present invention can be obtained based on unibody processing for material, thereby greatly simplifying the processing method and reducing the manufacturing cost. In addition, sound absorbing material can be set on the inner side of the panel (the side relative to the electronic device) to further reduce the noise.

Embodiment 2

This embodiment of the present invention describes the shape and material of the panel for ventilation and noise reduction based on the first embodiment.

In this embodiment, "left side of the panel" and "right side of the panel" refer to two relative planes in a certain view. To better explain this embodiment, "left side" of the panel is defined as the left side relative to the central axis viewed from the inside of the electronic device to the outside of the electronic device along a ventilation direction, and "right side" of the panel is defined as the right side relative to the central axis viewed from the inside of the electronic device to the outside of the electronic device along the ventilation direction. It can be understood that in another view, the "left-right sides" of the panel can also be described as "front and back sides" or "upper-lower sides". It should be noted that, if an irregular shape is applied, and a "central axis" cannot be accurately defined, a central axis can be self-defined according to an actual shape, and then left-right sides are defined, so as to implement this solution. These techniques pertain to common knowledge to those skilled in the art and details are not described.

In addition, to better describe this embodiment, if not otherwise specified, the "inside" and "outside" in this embodiment are relative to the apparatus that accommodates the electronic device. That is, "inside" in this embodiment indicates the inner (for example, the position of the electronic device) of the apparatus, and "outside" in this embodiment indicates the outer (for example, the outer surface of the apparatus viewed from the outside of the apparatus) of the apparatus. The preceding definitions also apply to other embodiments embodying this solution, and the preceding definitions are not described again in the embodiments.

The panel in this embodiment protrudes externally. The specific shape may be a plane with several sections of bent angles (referred to as "zigzag plane" for short), or an arc plane, or a plane of another shape (for example, a wave-shaped curved plane). In actual applications, for the sake of processing ease, the zigzag plane or arc plane easy to be processed is generally selected.

Figure 2:
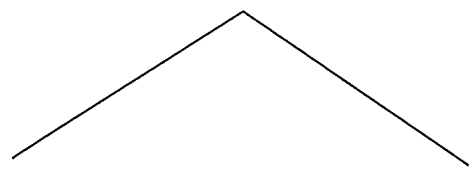
FIG. 2 is a top view of a panel in a shape provided in a second embodiment of the present invention.
Figure 3:
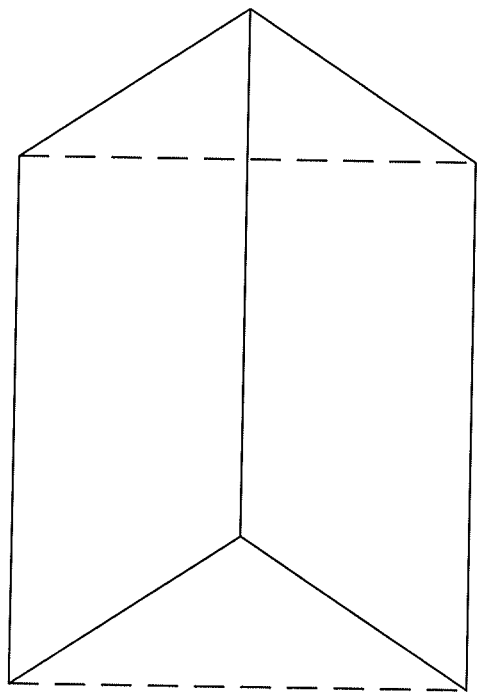
FIG. 3 is a three-dimensional view of the panel shown in FIG. 2 provided in the second embodiment of the present invention.
Figure 4:
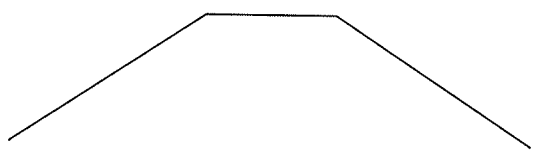
FIG. 4 is a top view of a panel in another shape provided in the second embodiment of the present invention.
Figure 5:
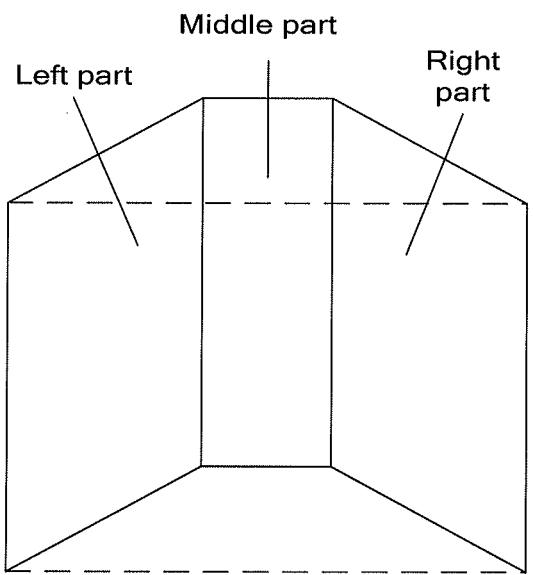
FIG. 5 is a three-dimensional view of the panel shown in FIG. 4 provided in the second embodiment of the present invention.

For the zigzag plane, an easiest implementation manner is to fold a plate by half using the central line of the plane as an axis. FIG. 2 shows the shape of the panel in the vertical view after being folded. FIG. 3 shows its three-dimensional view. Or, for the zigzag plane, the scheme of folding the plate once in a position left to the central line and once in a position right to the central line can also be adopted to form a three-sectional zigzag plane. In this way, a plane with no ventilation hole can be reserved on the panel to post a bulletin or for another purpose. FIG. 4 is a schematic diagram of the three-sectional zigzag plane in the vertical view. FIG. 5 shows its three-dimensional view (seen from the inside to the outside; it is the same in the subsequent description). Three parts (three sections) in the zigzag plane in the figure are expressed as "left part", "middle part", and "right part". The "middle part" may be with no ventilation hole, and is used to post a message or print a product Logo (logo) or for another purpose. Definitely, in actual applications, a zigzag plane with more sections, for example, four sections, five sections, can be used. Those skilled in the art can implement the folding method for four, five, and more sections according to the preceding folding method for three sections, and details are not described again.

Figure 6:
FIG. 6 is a top view of a panel in another shape provided in the second embodiment of the present invention.
Figure 7:
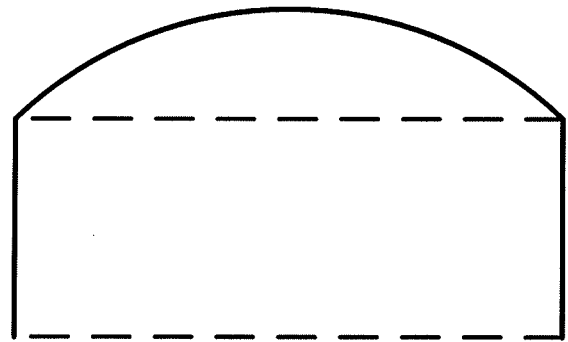
FIG. 7 is a three-dimensional view of the panel shown in FIG. 6 provided in the second embodiment of the present invention.

For an arc plane, FIG. 6 shows its vertical view, and FIG. 7 shows its three-dimensional view. It can be understood that an arc plane of another arc degree can be used, for example, protruding more to the outside, or sinking more to the inside.

Figure 8:
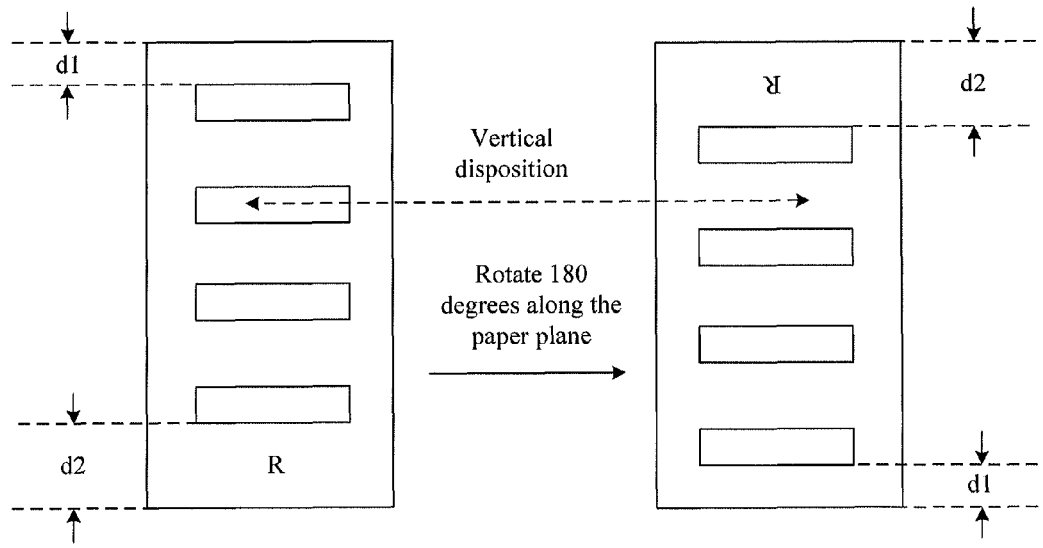
FIG. 8 is a schematic diagram of a position of a ventilation hole on a separate panel when an assembly method is used to form the panel provided in the second embodiment of the present invention.
Figure 9:
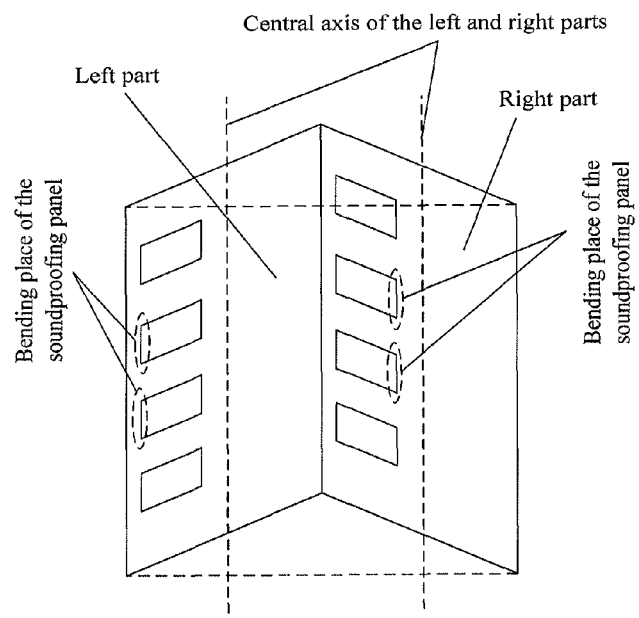
FIG. 9 is another schematic diagram of a position of a ventilation hole on a separate panel when an assembly method is used to form the panel provided in the second embodiment of the present invention.

During actual production, the panel that is based on the zigzag plane can also be generated by combining several panels. For example, for a three-sectional zigzag plane, three parts can be constructed by three different plates, and then they can be connected and assembled through different methods (for example, fixing by using a slot and a connector). During actual production, the "left part" and "right part" in the three-sectional plane can also use the same plate, and two same plates are assembled to form the "left part" and the "right part". It should be noted that, the positions of ventilation holes on the plates are set in a way that the ventilation holes on the panels can be staggered after the panels have been assembled. For example, as shown in FIG. 8, the distance d1 from a top ventilation hole to the top of a single plate and the distance d2 from a bottom ventilation hole to the bottom of the single plate can be set to be different values. One plate is selected as the "left part" of the panel. Then, another such plate is selected to rotate 180 degrees along a paper plane (that is, rotate 180 degrees by using the straight line vertical to the paper plane as the axis). As long as d1 and d2 are appropriate, the ventilation holes on both plates are in upper-lower staggered position. To form left-right staggered position, the setting method is similar: setting ventilation holes on the left part (or right part) of a plate, to form a structure of the left-right staggered position after splicing. FIG. 9 is a schematic diagram of splicing two same plates on the left sides of which ventilation holes are set to form the structure of the left-right staggered position. It should be noted that, if the material at the area of a ventilation hole is bent to form a sound insulation board, two plates each need to be bent at a different side line. For example, the plate of the "left part" should be bent at the side line on the left side of the rectangle, and the plate of the "right part" should be bent at the part near the central axis.

In this embodiment, the material of the panel can be common metal material, for example, iron alloy, nickel alloy, or aluminum alloy. If the panel needs to be bent, the metal material needs to have certain flexibility to prevent the panel from rupture when being bent. In addition, the panel can be implemented based on other material (such as plastic, wood, and glass). When factors, such as cost, security, and transportation, are taken into consideration, the metal material is generally selected during actual applications.

Embodiment 3

This embodiment describes the setting of ventilation holes on the panel for ventilation and noise reduction based on each of the preceding embodiments.

Figure 10:
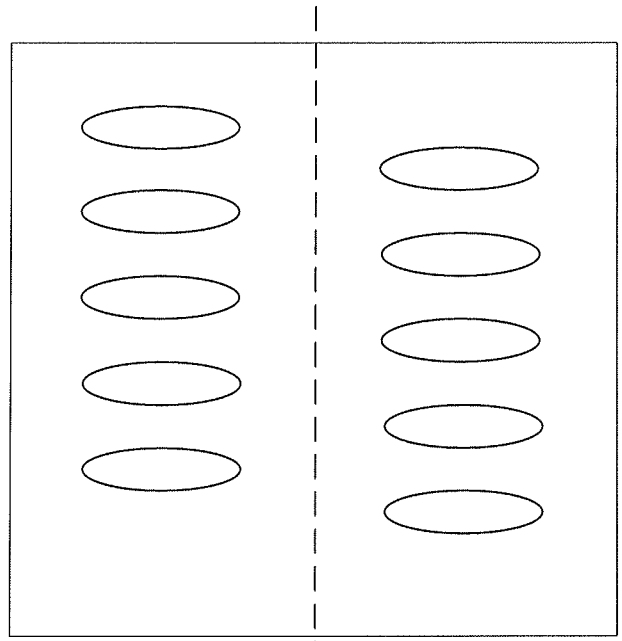
FIG. 10 is a schematic diagram of a ventilation hole with an oval shape provided in a third embodiment of the present invention.
Figure 11:
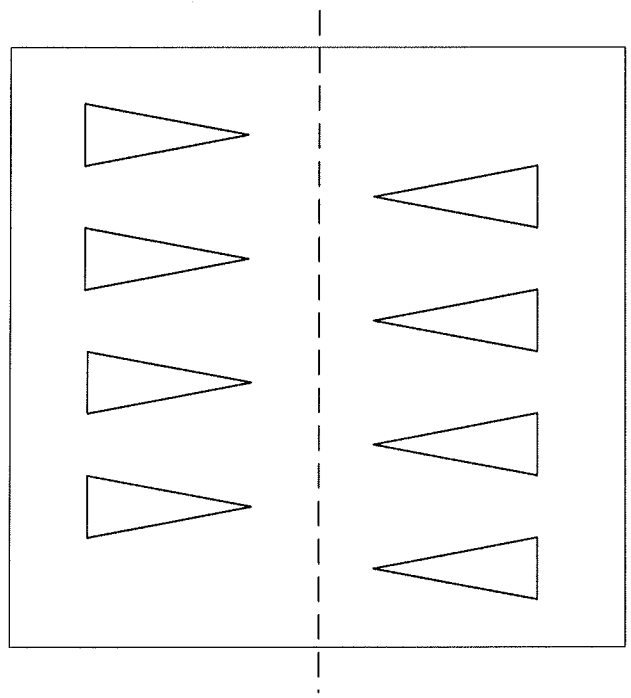
FIG. 11 is a schematic diagram of a ventilation hole with a triangle shape provided in the third embodiment of the present invention.

This embodiment does not confine the shape and size of a ventilation hole. Generally, a ventilation hole of a rectangular shape can be used, or a ventilation hole of another regular or irregular shape can be used. The ventilation hole shown in FIG. 1, FIG. 8, or FIG. 9 uses the rectangular shape. The ventilation hole shown in FIG. 10 uses an oval shape. The ventilation hole shown in FIG. 11 uses a triangular shape. In an actual application, a ventilation hole of another shape and size can be used, which is not confined here. For the ease of description, FIG. 10 and FIG. 11 provide only plane-based schematic diagrams, but do not concern the specific shapes. In each of the figures, a dotted line is only used to separate "left side" from "right side", and an expression method in another similar schematic diagram is the same as those used in FIG. 10 and FIG. 11.

It should be noted that, if the scheme of bending the material at the original position of a ventilation hole on the panel along a certain edge of a ventilation hole shape to form a sound insulation board is used, this edge of the ventilation hole shape used for bending cannot be set to be too short, so as to prevent rupture due to insufficient support of the bending part that is too short.

Figure 12:
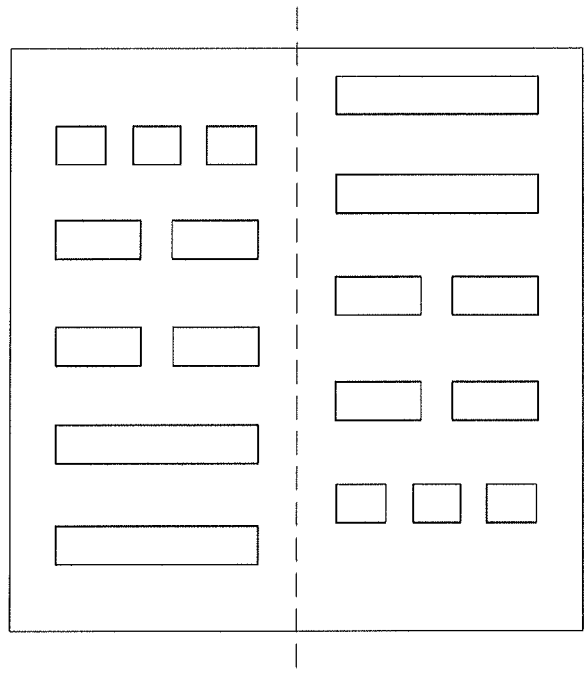
FIG. 12 is a schematic diagram of opening the different numbers of ventilation holes at each layer of the panel provided in the third embodiment of the present invention.

In this embodiment, the number of ventilation holes at each layer is not confined. One hole or a plurality of holes can be opened. FIG. 12 is a schematic diagram of deploying the different numbers of ventilation holes at layers. In FIG. 12, three ventilation holes are opened at some layers, and one or two ventilation holes are opened at other layers. In an actual application, based on the size and shape of the panel, a different solution of opening holes can be applied. For example, for a multi-sectional zigzag plane, one hole can be opened at each section on the left side and right side, or a hole can be opened at each of multiple sections.

The shape of each hole at each layer may differ. If two holes are opened at one layer, the shape of one hole can be oval, and the shape of the other hole can be a shape, such as rectangle, triangle, except oval.

In an actual application, for the sake of the ease of processing, regular shapes, such as rectangle, triangle, and oval, are generally used.

Embodiment 4

This embodiment describes the setting of the sound insulation board on the panel for ventilation and noise reduction based on each of the preceding embodiments.

The sound insulation board here refers to a board that produces sound insulation effect. The specific material of the board is the material that has certain density. For example, the material of the board may be metal, wood, plastic, pasteboard, or the like. Selection of the specific material of the board pertains to the common techniques to those skilled in the art, and details are not described here.

A sound insulation board can be set through unibody design or combination. A preferred scheme is to obtain the board through unibody design, that is, certain edges of a ventilation hole shape are cut first, and then the material at the original position of a ventilation hole is bent along the uncut edge of the ventilation hole shape, to obtain the ventilation hole and the sound insulation board at the same time. In this way, with the sound insulation board, at least certain of the sound from the inside of the electronic device cannot pass through the ventilation hole directly.

The angle between the sound insulation board and the plane where the ventilation hole is located can be adjusted according to an actual situation. For example, if it is required to prevent all sound from directly getting out of ventilation holes, sound insulation boards each can be bent to a proper angle, so that no sound can directly pass through the ventilation holes. Definitely, this embodiment does not confine the case that all sound is prevented from getting out of the ventilation holes, but this embodiment only prevents certain sound from getting out of ventilation holes, that is, sound insulation boards each are adjusted to a specific angle, so that certain sound can directly pass through the ventilation holes. The adjustment of the angle of a sound insulation board pertains to the common techniques for those skilled in the art. During the process of bending the sound insulation board from an original position on the panel to the inside, those skilled in the art can easily learn that not all sound can pass through ventilation holes when sound insulation boards are adjusted to certain angles, and certain sound can pass through the ventilation holes when the sound insulation boards are adjusted to other angles.

If a combination manner is used, the material of the sound insulation board may be the same as or different from the material of the panel. For example, if the panel uses the metal, while the sound insulation board uses the material, such as the metal, wooden, plastic. The combination manner is performed through soldering, pasting, connecting through a connector or the like. The angle can also be set based on the above setting method, and details are not described herein again.

If ventilation holes at each layer have a plurality of sound insulation boards, each sound insulation board can be obtained through the processing with the same or different methods, or the adjustment of the angle may be the same or different. For the sake of the ease of the processing, an unibody design processing method is generally preferred in actual applications, and the angles of all sound insulation boards are uniformly adjusted to the same angle.

Figure 13:
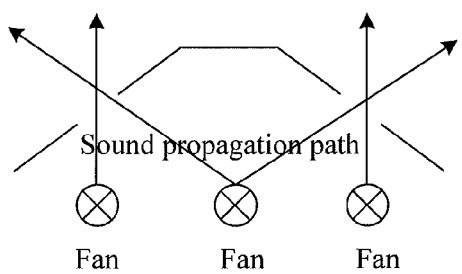
FIG. 13 is a schematic diagram of a noise reduction principle provided in a fourth embodiment of the present invention.
Figure 13:
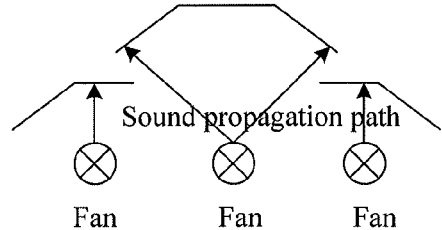

FIG. 13 is a schematic diagram of the sound insulation principle of a sound insulation board. FIG. 13 (a) is a schematic diagram of sound transfer when no sound insulation board is used for sound insulation. In this case, the sound can be directly transferred to human ears. FIG. 13 (b) is a schematic diagram of sound transfer after a sound insulation board is added. It can be seen that the sound cannot be directly transferred to human ears, but can only be transferred through reflection, radiation or other manners. In this case, certain sound (especially mid- and high-frequency sound) will be prevented from being transferred to human ears, thereby reducing the noise.

Embodiment 5

This embodiment describes in detail the staggered position setting of ventilation holes on the panel for ventilation and noise reduction based on each of the preceding embodiments.

The "staggered position" in this embodiment is to prevent the air from two adjacent sides from forming face-to-face blowing when panels are placed side by side. A specific "staggered position" manner is not confined. In an actual application, for the ease of manufacturing, generally, a regular arrangement manner (for example, arrangement in a row or line, or also known as "layer") is used to arrange ventilation holes. As shown in FIG. 1, arrangement is performed by using an upper-lower layer (or row) staggered position manner. Or, arrangement is performed by using a left-right layer (or row) staggered position manner. Based on the preceding two combinations, all other staggered position manners can be adopted to adjust the positions of the ventilation holes (such as, position, angle, shape, and size adjustment) to meet the purpose of the staggered position.

For the ease of description, a "layer staggered position" method is described here. All other staggered position methods can be obtained based on the "layer staggered position" method (that is, other staggered position methods, which are not restricted in a layer staggered position, can be understood as "staggered position"). This embodiment does not provide detailed description.

Figure 14:
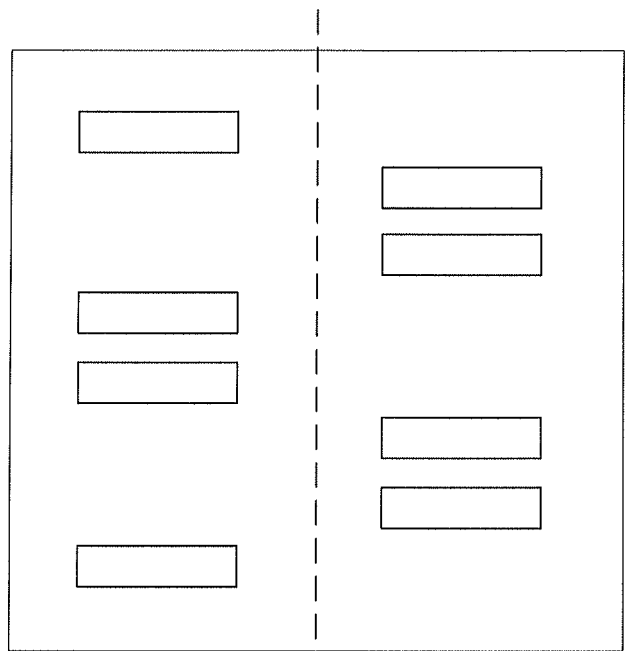
FIG. 14 is a schematic diagram of the upper-lower stagger by using two stagger layers provided in a fifth embodiment of the present invention.

A common layer staggered position setting manner, which is also a preferred layer staggered position manner in this embodiment, is to use upper-lower layer staggered position, that is, ventilation holes at layers on the left side and right side of the panel are deployed in the vertical height relative to the horizontal plane from the top down in a non-alignment manner. Specifically, ventilation holes at layers on the left side and right side can be deployed in a non-alignment manner every other layer, or ventilation holes at layers on the left side and right side can be deployed in a non-alignment manner every other layers. FIG. 10, FIG. 11, and FIG. 12 are schematic diagrams of performing a layer staggered position every other layer. FIG. 14 is a schematic diagram of performing the layer staggered position every other two layers. Definitely, this embodiment does not exclude a combination setting manner where layer staggered position is implemented every other layer at certain positions and the layer staggered position is implemented every other layers at other positions.

Figure 15:
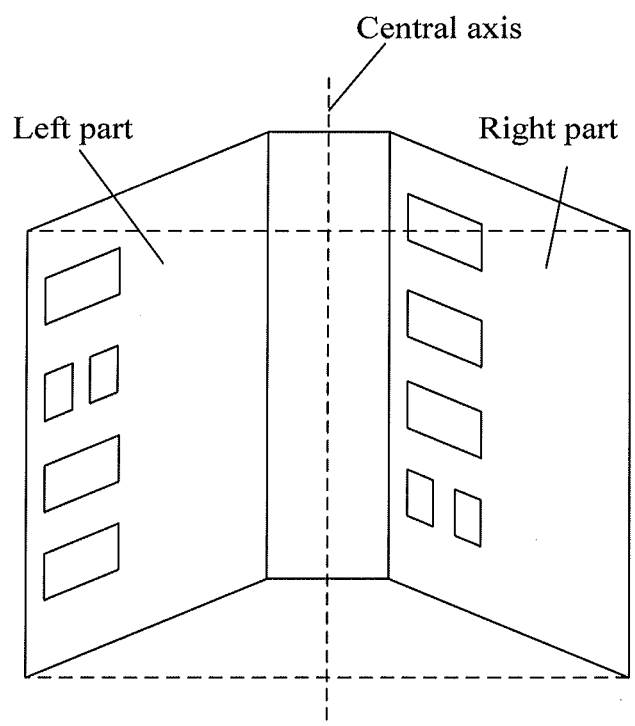
FIG. 15 is a schematic diagram of separating left-right layers based on a three-sectional zigzag plane provided in the fifth embodiment of the present invention.
Figure 16:
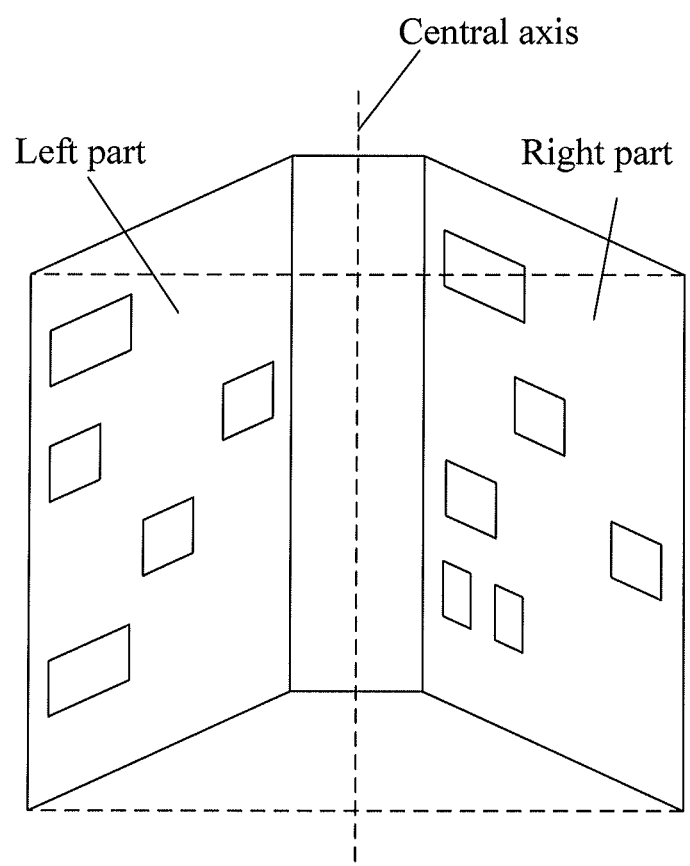
FIG. 16 is a schematic diagram of separating left-right layers by using an interval of one or a plurality of ventilation holes provided in the fifth embodiment of the present invention.

Another layer staggered position is left-right layer staggered position, that is, ventilation holes at layers on the left side and right side of the panel are deployed in the vertical plane perpendicular to the horizontal plane. Each layer include one or multiple ventilation holes in the left-right layer staggered position, so that when the left side of the panel and the right side of the panel are combined along the central axis of the panel to one plane, the ventilation holes on the left side of the panel and ventilation holes on the right side of the panel are deployed in a left-right stagger manner on the combined plane. Specifically, it can be understood that the panel is folded along the central axis by half to form a plane after folding, and the plane after folding is unfolded on the paper plane; seen from left to right in the direction of the paper plane, the layer staggered position is performed on the plane vertical to the horizontal plane. FIG. 15 is a schematic diagram of performing the left-right layer staggered position based on a three-sectional zigzag plane. As shown in the figure, one or multiple ventilation holes are deployed on the position (that is, left of the "left part") far from the central axis of the entire panel in the "left part" of the three-sectional zigzag plane, and one or multiple ventilation holes are deployed on the position (that is, left of the "right part") near the central axis of the entire panel in the "right part" of the three-sectional zigzag plane. Definitely, similar to the upper-lower layer staggered position manner, the left-right layer staggered position can be implemented every other ventilation hole or every other ventilation holes or a combination of both, as shown in FIG. 16.

It should be noted that, through the left-right staggered position (layer staggered position), a proper staggered position gap and a proper panel shape (for example, protruding arc) needs to be set to prevent the "strong face-to-face blowing interference". This is because the air flows on opposite sides of side-by-side cabinets are at the same horizontal plane. If the gap is too small, certain interference may be generated. When positions of ventilation holes are set through upper-lower staggered position (layer staggered position), the interference is much smaller because the ventilation holes are at different layers. Therefore, in actual applications, the upper-lower layer staggered position manner can be preferably selected.

Figure 17:
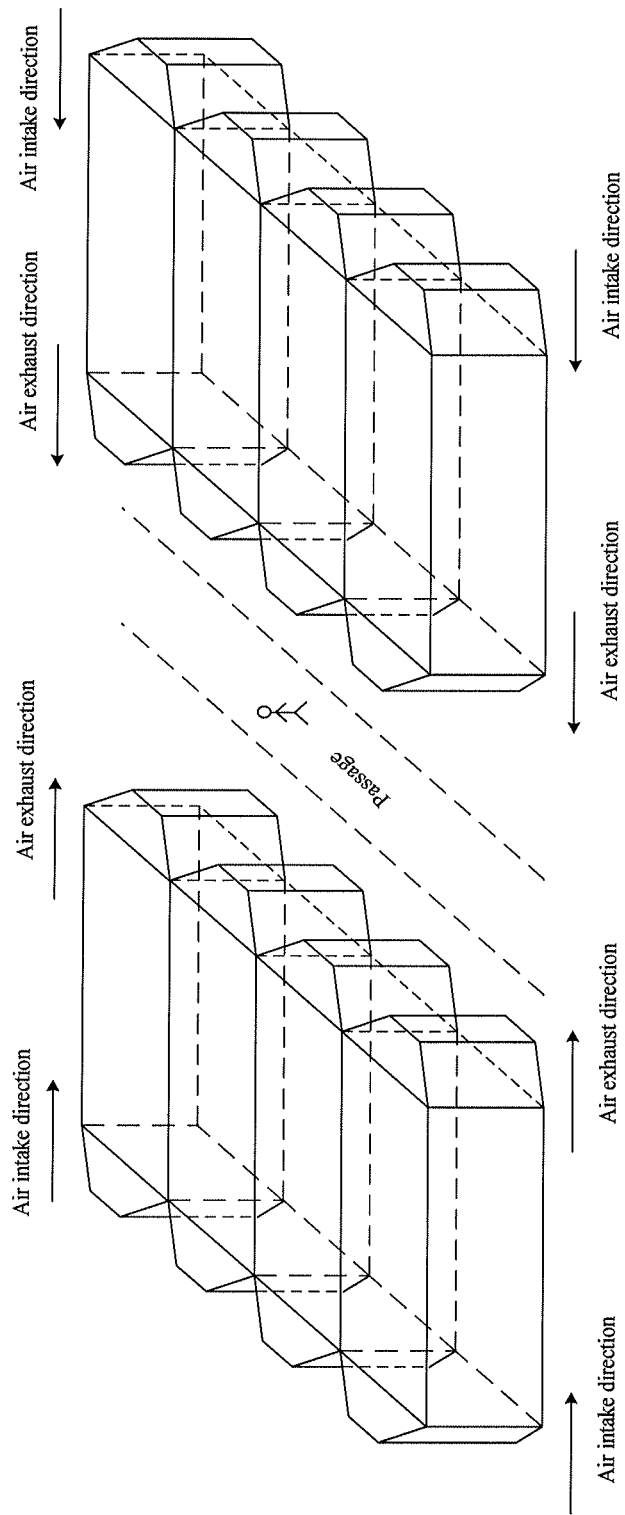
FIG. 17 shows an application scenario of an embodiment of the present invention.
Figure 18:
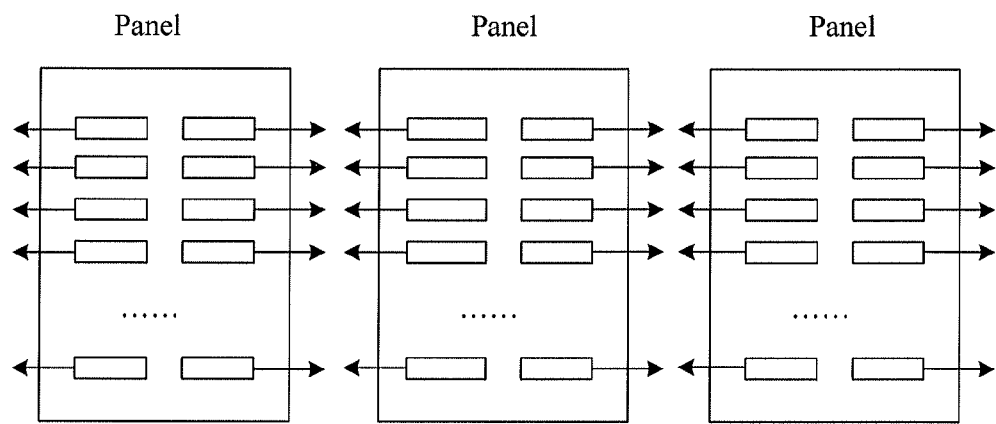
FIG. 18 is a schematic diagram of an air exhaust direction when layer staggered position is not implemented provided in an embodiment of the present invention.
Figure 19:
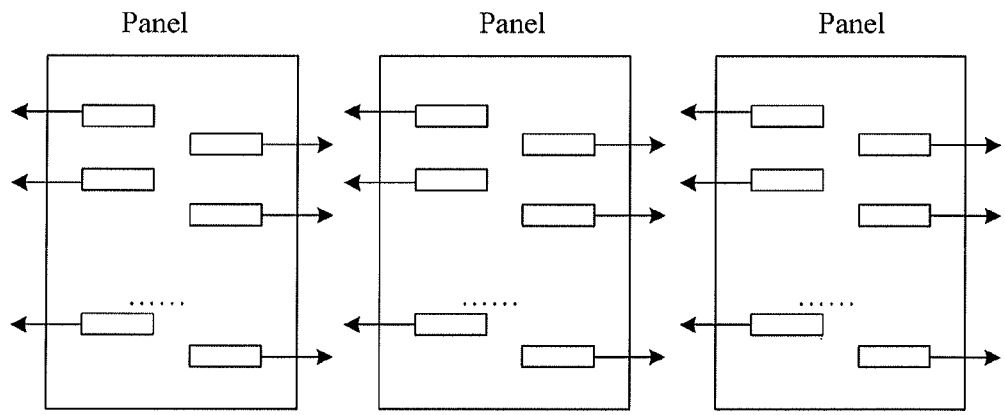
FIG. 19 is a schematic diagram of an air exhaust direction when layer staggered position is implemented provided in an embodiment of the present invention.

The staggered position setting is mainly used to prevent an opposing flow problem generated when panels are placed side by side. FIG. 17 shows a common scenario in a large-scale data center or equipment room in an actual application. That is, multiple cabinets in which electronic devices are installed are placed side by side. To perform ventilation and noise reduction for these cabinets, panels for ventilation and noise reduction are installed at the ventilation ports of each cabinet (left-right sides of each cabinet in the figure). In this case, if a staggered position scheme is not used, as shown in FIG. 18, the heated air exhausted from two opposite panels will blow face-to-face, so as to affect their respective air circulation. In addition, certain heated air gets out of one panel and enters the other panel, so as to affect their respective heat dissipation. FIG. 19 is a schematic diagram of air flow after the staggered position setting is used (here, it is the schematic diagram of the principle of upper-lower layer staggered position; the principle of the left-right layer staggered position or other staggered position manner is similar). The air from a panel may be blown to the enclosure part of an opposite panel, so that the air may not enter the opposite panel through ventilation holes, thereby improving the effect heat dissipation.

Each of the preceding embodiments describes in detail the panel for ventilation and noise reduction in this scheme. Those skilled in the art can also implement this scheme through free combination of all schemes in the preceding embodiments. In addition, for better assembly with the ventilation port of the electronic device, certain design can be made at the connection between the panel and the electronic device, for example, connecting parts are added, or the panel is bent to a certain shape to match the port of the electronic device. Those skilled in the art can select proper types for the connection according to actual application scenarios, and the design is not confined herein.

Embodiment 6

Figure 20:
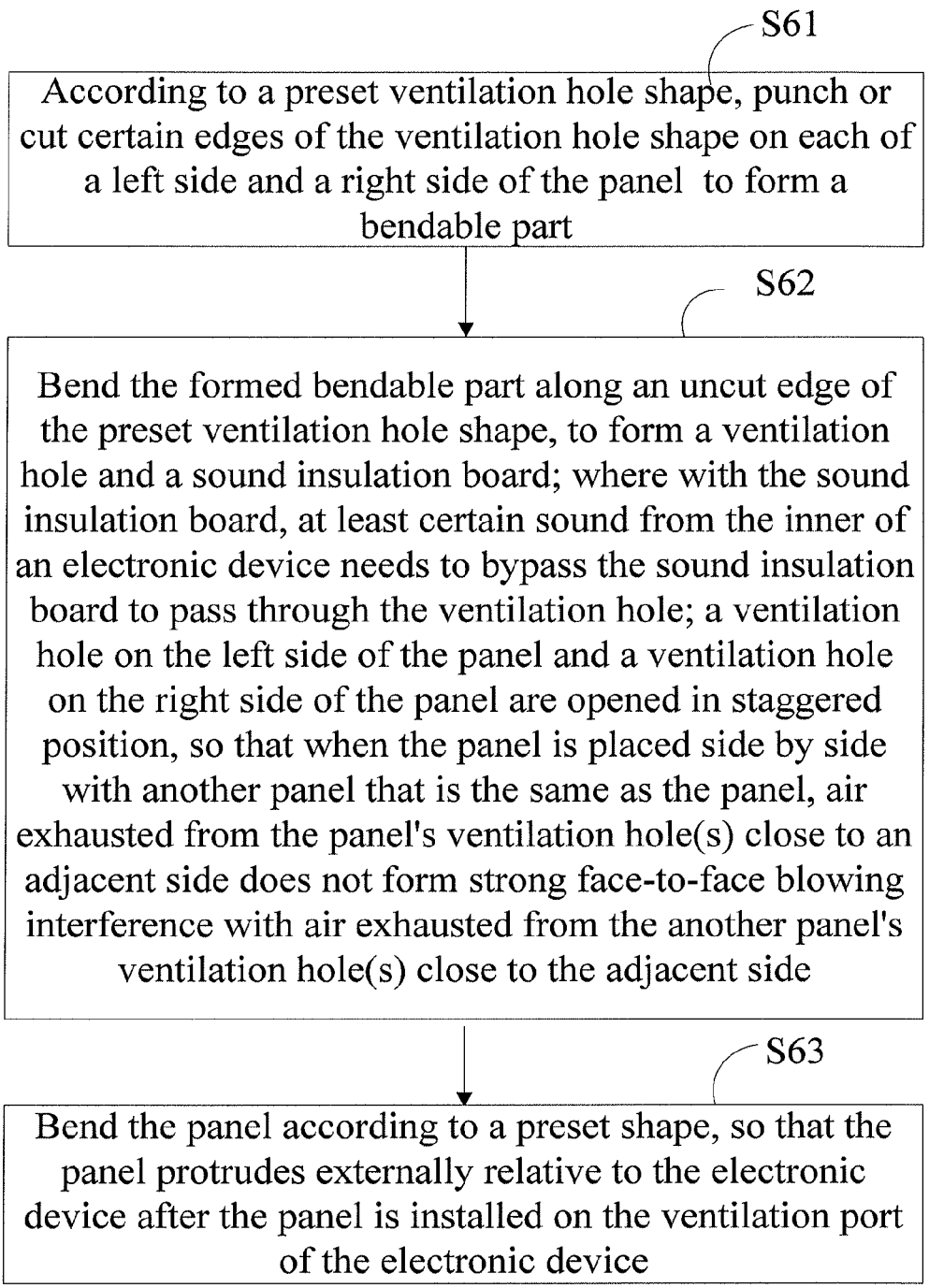
FIG. 20 is a flowchart of a method for manufacturing a panel for ventilation and noise reduction provided in a sixth embodiment of the present invention.

This embodiment of the present invention provides a method for manufacturing a panel for ventilation and noise reduction based on the preceding embodiments. The panel is installed at a ventilation port of an electronic device. As shown in FIG. 20, the method includes the following steps:

S61: Punch (punch) or cut certain edges of a ventilation hole shape on each of a left side and a right side of the panel according to the preset ventilation hole shape to form a bendable part.

S62: Bend the formed bendable part along an uncut edge of the preset ventilation hole shape, to form a ventilation hole and a sound insulation board at the same time; where with the sound insulation board, at least certain sound from the inner of an electronic device needs to bypass the sound insulation board to pass through the ventilation hole; a ventilation hole on the left side of the panel and a ventilation hole on the right side of the panel are opened in staggered position in the vertical direction relative to the horizontal plane, so that when the panel is placed side by side with another panel that is the same as the panel, air exhausted from the panel's ventilation hole(s) close to an adjacent side does not form strong face-to-face blowing interference with air exhausted from the another panel's ventilation hole(s) close to the adjacent side.

S63: Bend the panel according to a preset shape, so that the panel protrudes externally relative to the electronic device after the panel is installed on the ventilation port of the electronic device. For example, the panel is bent to the three-sectional zigzag plane in the preceding embodiments, or an arc plane, or a plane of another shape.

The sequence of steps S62 and S63 is not strictly confined. The panel can be bent as a whole first, and then the ventilation hole and sound insulation board are obtained through bending.

After these steps, the following step can further be included:

S64: Set sound absorbing material on the side of the panel facing the electronic device.

Figure 21:
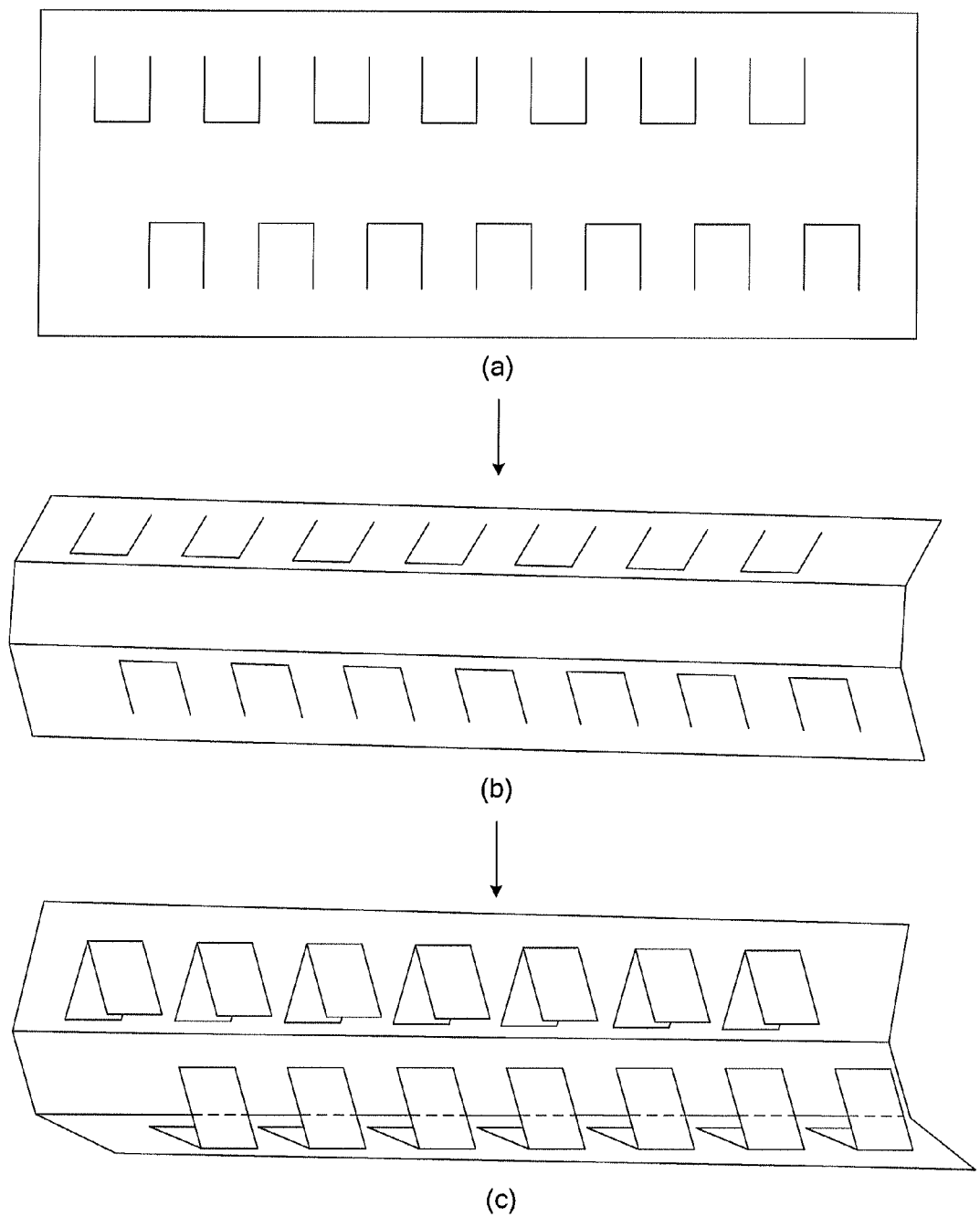
FIG. 21 is a schematic diagram of the method for manufacturing a panel for ventilation and noise reduction provided in the sixth embodiment of the present invention.

FIG. 21 is a schematic diagram of a manufacturing method according to an embodiment. As shown in FIG. 21 (*a*), on a flat panel, certain edges of a ventilation hole shape are punched (punched) or cut according to the preset ventilation hole shape to form a bendable part. The bendable part here after being bent is a sound insulation board. In FIG. 21 (*a*), the black lines except the four long edges indicate the tracks of cutting or punching. In practical applications, a punching method is commonly used to remove the parts in these black lines and bendable parts (which later form sound insulation boards) are left. This method is also called "blanking" in a mechanical manufacturing field.

As shown in FIG. 21 (*b*), the entire panel is then bent, for example, the panel is bent into a three-sectional panel in this figure. In practical applications, the panel can also be bent into other shapes, such as a two-section panel and an arc panel.

As shown in FIG. 21 (*c*), the bendable parts in step (a) are bent along the tracks that are left in cutting or punching to form the ventilation holes and sound insulation boards at the same time.

The sequence of the steps (b) and (c) is not strictly confined. Step (c) can also be executed before step (b), or certain parts of step (b) or (c) (for example, first bending one plane or first performing bending to form certain sound insulation boards) are executed first, and then other parts of step (c) or (b) are correspondingly executed.

For step (a), one method is to perform punching or cutting at the left side and right side directly at the same time, which requires a large machine (a punching machine that has the capability of punching both sides at the same time is required); another method is to perform punching or cutting at the left side only, and then rotate the panel to perform punching or cutting at the right side, which requires a relatively small machine (a punching machine that has the capability of punching one side is only required; in this case, the size and cost are lower).

Figure 22:
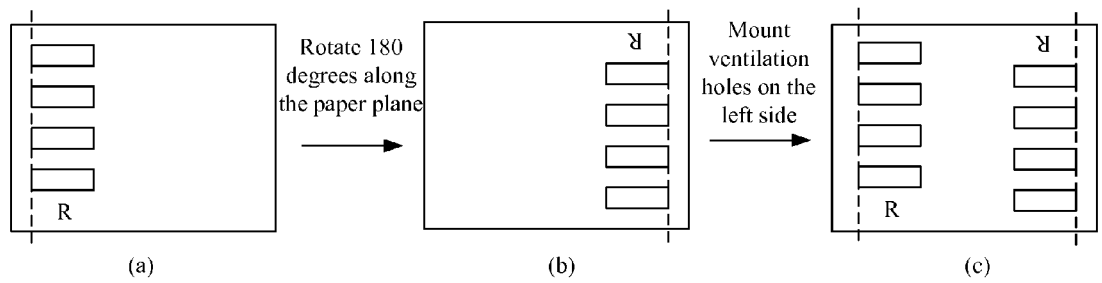
FIG. 22 is a method for punching or cutting a ventilation hole shape provided in the sixth embodiment of the present invention.

Specifically, as shown in FIG. 22, punching or cutting is performed once on the left side according to step (a), where the letter "R" is used for reference in figure (a) to facilitate the understanding of the subsequent rotation step; after punching or cutting is performed once according to step (a), the panel is rotated with 180 degrees along a paper plane, or more accurately, the panel is rotated with 180 degrees by using the straight line vertical to the paper plane as an axis; after the rotation, the original right side in (a) is now the left side in (c). In this case, punching or cutting is performed for another time on the left side in (c) to form ventilation holes that are in staggered position. To form upper-lower staggered position, the distance from a top ventilation hole on a single plate to the top of the plate and the distance from a bottom ventilation hole to the bottom of the plate need to be properly set to be different values, which has been described in the second embodiment, and details are not described herein again. By using this method, a smaller device can be used for processing, thereby reducing the processing cost.

By using a one-time punching or cutting method, the working efficiency can be increased. Definitely, this embodiment of the present invention does not exclude other non-one-time punching or cutting methods. For example, the shape of each ventilation hole can be punched or cut one by one.

In addition, for a panel with a zigzag plane, sections of the zigzag plane can be separately processed, and then connected to form the panel. Meanwhile, the method of rotation provided in the preceding embodiment can be combined to process the panels at different sides to lower the processing cost.

Embodiment 7

Figure 23:
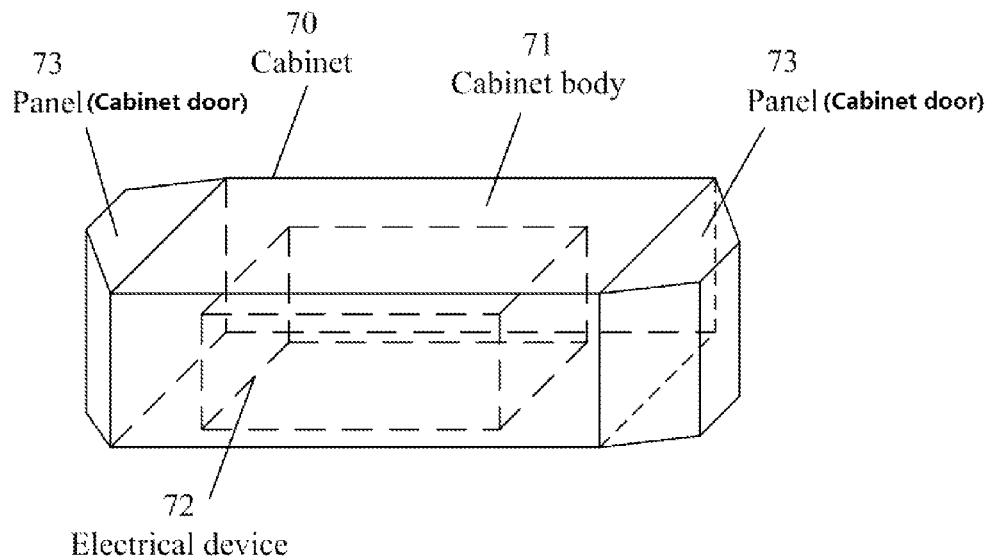
FIG. 23 is a structural schematic diagram of a cabinet provided in a seventh embodiment of the present invention.

As shown in FIG. 23, based on the preceding embodiments, this embodiment of the present invention provides a cabinet 70, including:

a cabinet body 71, configured to accommodate an electronic device 72, where one or a plurality of cabinet doors are formed at an opening of the cabinet body, and a panel 73 in each of the preceding embodiments is set on the one or the plurality of cabinet doors.

The cabinet body is generally a cube, where one or multiple openings form cabinet doors. The panel for ventilation and noise reduction in the preceding embodiments is set on a door, so that favorable comprehensive benefits can be yielded between ventilation and noise reduction. For the ease of maintenance, the setting should be removable, or rotatable, or movable. To some extent, it can be regarded that this panel is one or multiple new "doors" of the cabinet.

It should be noted that applications in other similar fields (for example, install the preceding panel for ventilation and noise reduction on the front and back sides of the chassis of a personal computer) can also be viewed as equivalent applications of the embodiments of the present invention.

Embodiment 8

Figure 24:
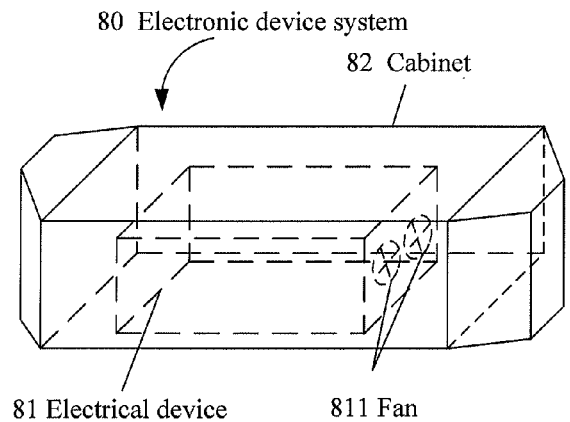
FIG. 24 is a structural schematic diagram of an electronic device system provided in an eighth embodiment of the present invention.

As shown in FIG. 24, based on the preceding embodiments, this embodiment of the present invention provides an electronic device system 80, including:

an electronic device 81, which includes a fan 811 configured to perform heat dissipation for the electronic device; where a cabinet 82 in the preceding embodiments is configured to accommodate the electronic device, and reduce noise produced by the fan, so as to ensure air ventilation and convection.

Embodiment 9

Figure 25:
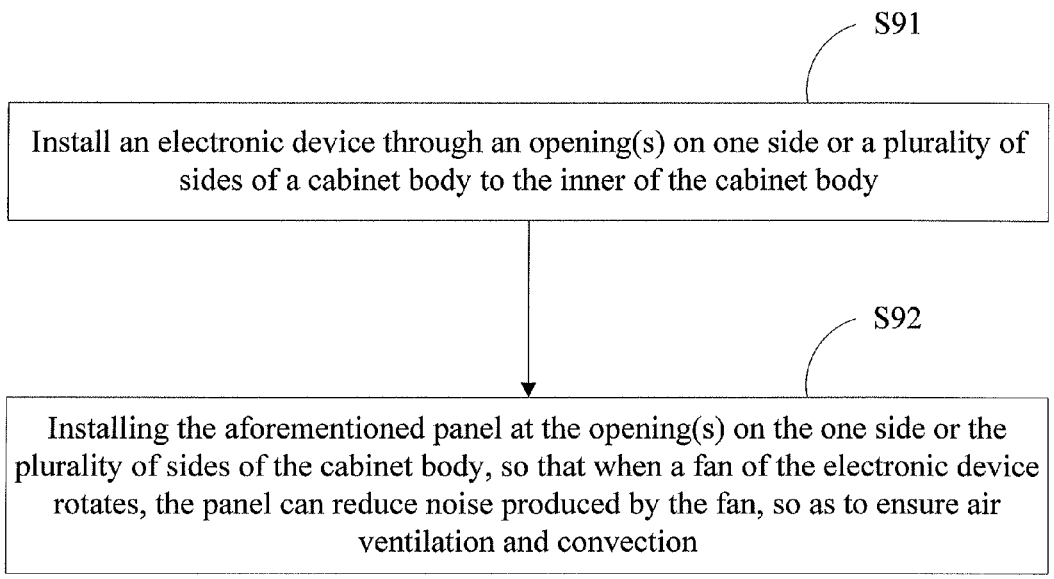
FIG. 25 is a flowchart of a method for ventilation and noise reduction for an electronic device provided in a ninth embodiment of the present invention.

As shown in FIG. 25, based on the preceding embodiments, this embodiment of the present invention provides a method for ventilation and noise reduction for an electronic device. The method includes the following steps:

S91: Install an electronic device through an opening(s) on one side or a plurality of sides of a cabinet body to the inner of the cabinet body.

S92: Installing the aforementioned panel at the opening(s) on the one side or the plurality of sides of the cabinet body, so that when a fan of the electronic device rotates, the panel can reduce noise produced by the fan, to ensure air ventilation and convection.

The preceding exemplary embodiments further describe the purposes, technical solutions, and advantages of the present invention. It should be understood that the above description is only about the exemplary embodiments of the present invention, which does not impose limitation on the present invention. Any modification, equivalent replacement, and improvement made within the idea and principle of the present invention should fall within the protection scope of the present invention.

What is claimed is:

1. A panel for ventilation and noise reduction, wherein the panel is installed on a ventilation port of an apparatus that accommodates an electronic device, and the panel protrudes externally relative to the electronic device, the panel comprising:

a left part and a right part, wherein the left and right parts of the panel each comprises at least one ventilation hole, and a sound insulation board is placed near each ventilation hole along a side of the panel facing the electronic device; and wherein the panel has a top edge and a bottom edge, the at least one ventilation hole on the left part of the panel and the at least one ventilation hole on the right part of the panel are located in staggered positions, so that a shortest distance from the top edge of the panel to any ventilation hole on the left part of the panel is different from a shortest distance from the top edge of the panel to each ventilation hole on the right part of the panel.

2. The panel according to claim 1, wherein the ventilations holes are in a polygon shape, and the panel is of a unibody design in which, at each part of the panel, the at least one ventilation hole and the sound insulation board near the ventilation hole are formed by cutting the panel along all except one edge of the ventilation hole and bending the panel at the hole area toward the side facing the electronic device along the uncut edge of the ventilation hole by an angle, so as to form the ventilation hole with the sound insulation board attached to the uncut edge of the ventilation hole.

3. The panel according to claim 2, wherein the angle between the at least one ventilation hole and the sound insulation board attached to the hole is such that at least certain sound from the electronic device needs to bypass the sound insulation board in order to pass through the at least one ventilation hole.

4. The panel according to claim 2, wherein the ventilation holes on the panel are in one or more of a triangle, a rectangle or a square shape.

5. The panel according to claim 1, wherein each of the left part and the right part of the panel is divided into a left section and a right section along a vertical line from the top edge to the bottom edge of the panel, and the at least one ventilation hole on the left part of the panel is located in the left section of the left part of the panel, and the at least one ventilation hole on the right part of the panel is located in the right section of the right part of the panel in the staggered positions from the top edge of the panel to the bottom edge of the panel along the respective vertical line.

6. The panel according to claim 1, further comprising a middle part between the left part and the right part, wherein
the panel is formed by bending a flat plate along a first vertical line by a first angle and bending the flat plate along a second vertical line by a second angle, the area between the first vertical line and the second vertical line is the middle part.

7. The panel according to claim 1, wherein the panel is made of a metal material.

8. The panel according to claim 1, wherein a sound absorbing material is set on the side of the panel facing the electronic device.

9. The panel according to claim 1, wherein the at least one ventilation hole on the left part of the panel and the at least one ventilation hole on the right part of the panel are located in staggered positions such when the left part of the panel and the right part of the panel are folded along a central axis to be parallel to each other, any ventilation holes on the left part of the panel do not overlap with any ventilation holes on the right part of the panel, and vice versa.

10. A cabinet for accommodating an electric device, comprising:
a cabinet body having at least one cabinet door, and a panel set on the at least one cabinet door;
wherein the panel comprises a left part and a right part,
wherein the left and right parts of the panel each comprises at least one ventilation hole, and a sound insulation board is placed near each ventilation hole along a side of the panel facing the electronic device; and
wherein the panel has a top edge and a bottom edge, the at least one ventilation hole on the left part of the panel and the at least one ventilation hole on the right part of the panel are located in staggered positions, so that a shortest distance from the top edge of the panel to any ventilation hole on the left part of the panel is different from a shortest distance from the top edge of the panel to each ventilation hole on the right part of the panel.

11. The cabinet according to claim 10, wherein
the ventilations holes are in a polygon shape, and the panel is of a unibody design in which, at each part of the panel, the at least one ventilation hole and the sound insulation board near the ventilation hole are formed by cutting the panel along all except one edge of the ventilation hole and bending the panel at the hole area toward the side facing the electronic device along the uncut edge of the ventilation hole by an angle, so as to form the ventilation hole with the sound insulation board attached to the uncut edge of the ventilation hole.

12. The cabinet according to claim 11, wherein the angle between the at least one ventilation hole and the sound insulation board attached to the hole is such that at least certain sound from the electronic device needs to bypass the sound insulation board in order to pass through the at least one ventilation hole.

13. The cabinet according to claim 11, wherein the ventilation holes on the panel are in one or more of a triangle, a rectangle or a square shape.

14. The cabinet according to claim 10, wherein each of the left part and the right part of the panel is divided into a left section and a right section along a vertical line from the top edge to the bottom edge of the panel, and the at least one ventilation hole on the left part of the panel is located in the left section of the left part of the panel, and the at least one ventilation hole on the right part of the panel is located in the right section of the right part of the panel in the staggered positions from the top edge of the panel to the bottom edge of the panel along the respective vertical line.

15. The cabinet according to claim 10, the panel further comprises a middle part between the left part and the right part, wherein
the panel is formed by bending a flat plate along a first vertical line by a first angle and bending the flat plate along a second vertical line by a second angle, the area between the first vertical line and the second vertical line is the middle part.

16. The cabinet according to claim 10, wherein the panel is made of a metal material.

17. The cabinet according to claim 10, wherein a sound absorbing material is set on a side of the panel facing the electronic device.

18. The cabinet according to claim 10, wherein the at least one ventilation hole on the left part of the panel and the at least one ventilation hole on the right part of the panel are located in staggered positions such when the left part of the panel and the right part of the panel are folded along a central axis to be parallel to each other, any ventilation holes on the left part of the panel do not overlap with any ventilation holes on the right part of the panel, and vice versa.

\* \* \* \* \*